(12) United States Patent
Boxho

(10) Patent No.: US 7,002,402 B2
(45) Date of Patent: Feb. 21, 2006

(54) METHOD OF PRODUCING A DESIRED CURRENT

(75) Inventor: Jean Boxho, Woluwe-Saint-Lambert (BE)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/835,402

(22) Filed: Apr. 30, 2004

(65) Prior Publication Data

US 2004/0201507 A1 Oct. 14, 2004

Related U.S. Application Data

(63) Continuation of application No. 10/326,168, filed on Dec. 23, 2001, now Pat. No. 6,738,000, which is a continuation of application No. 09/908,569, filed on Jul. 20, 2001, now Pat. No. 6,501,402.

(30) Foreign Application Priority Data

May 9, 2001 (GB) .................................... 0111313

(51) Int. Cl.
*G05F 1/10* (2006.01)
(52) U.S. Cl. ..................................... 327/543; 327/541
(58) Field of Classification Search ................ 327/538, 327/540, 541, 542, 543; 323/315
See application file for complete search history.

(56) References Cited

U.S. PATENT DOCUMENTS

| | | | |
|---|---|---|---|
| 4,855,685 A * | 8/1989 | Hochschild | 330/282 |
| 5,142,580 A | 8/1992 | Neil | |
| 5,149,994 A * | 9/1992 | Neu | 327/538 |
| 5,164,725 A | 11/1992 | Long | 341/118 |
| 5,194,765 A * | 3/1993 | Dunlop et al. | 326/87 |
| 5,254,883 A * | 10/1993 | Horowitz et al. | 326/30 |
| 5,457,407 A * | 10/1995 | Shu et al. | 326/30 |
| 5,506,541 A * | 4/1996 | Herndon | 327/541 |
| 5,646,619 A | 7/1997 | Daubert et al. | 341/118 |
| 5,703,586 A | 12/1997 | Tucholski | 341/144 |

(Continued)

FOREIGN PATENT DOCUMENTS

EP 0 898 374 A2 8/1998

(Continued)

OTHER PUBLICATIONS

Copy of European Search Report for Appln. 02 25 3214 mailed Dec. 18, 2003.

(Continued)

*Primary Examiner*—Terry D. Cunningham
(74) *Attorney, Agent, or Firm*—Sterne, Kessler, Goldstein & Fox P.L.L.C

(57) ABSTRACT

A current source DAC has calibration of the current sources used for providing the analog output. There are two outputs, one of which provides the output current or else a differential output is provided. The calibration is cyclic and the current source outputs switched to the output terminals are selected as a function of the point within the calibration cycle. The current stage of the cyclic calibration process is thus taken into account in the D/A conversion. For example, the average time since calibration for all current sources having outputs switched to the first output may be approximately equal to the average time since calibration for all current sources having outputs switched to the second output. In this way, the average current of the cells switched to one terminal is identical to the average current of the cells switched to the other terminal, and the average current of the cells switched to each terminal remains constant in time irrespective of the digital signal value being converted. This ensures DAC linearity.

6 Claims, 3 Drawing Sheets

U.S. PATENT DOCUMENTS

| | | | |
|---|---|---|---|
| 5,870,044 A | 2/1999 | Dell'ova et al. | 341/120 |
| 5,877,617 A * | 3/1999 | Ueda | 323/316 |
| 5,949,362 A | 9/1999 | Tesch et al. | 341/144 |
| 5,955,980 A | 9/1999 | Hanna | 341/120 |
| 5,977,818 A * | 11/1999 | Czarnul et al. | 327/541 |
| 6,038,261 A | 3/2000 | Mestdagh | |
| 6,304,121 B1 * | 10/2001 | Wang | 327/170 |
| 6,473,015 B1 | 10/2002 | Andersson | 341/136 |
| 6,501,402 B1 | 12/2002 | Boxho | 341/120 |
| 6,545,522 B1 * | 4/2003 | Mughal et al. | 327/334 |
| 6,621,439 B1 | 9/2003 | Bugeja | 341/145 |
| 6,642,699 B1 * | 11/2003 | Gregoire, Jr. | 323/314 |
| 6,650,265 B1 | 11/2003 | Bugeja | 341/144 |

FOREIGN PATENT DOCUMENTS

| | | |
|---|---|---|
| EP | 0 917 326 A1 | 5/1999 |

OTHER PUBLICATIONS

Chow et al., Mitigating Clipping Noise in Multi-carrier Systems, ICC 97 Montreal, Que., Canada Jun. 8-12, 1997, pp. 715-718, section 3, vol. 2, New York, NY.

European Search Report for European Application No. 01305376.4 mailed on Apr. 22, 2005.

* cited by examiner

METHOD OF PRODUCING A DESIRED CURRENT

CROSS REFERENCE TO RELATED APPLICATION

This patent application is a continuation of U.S. patent Ser. No. 10/326,168 (now U.S. Pat. No. 6,738,000), filed Dec. 23, 2002, which is a continuation of Ser. No. 09/908,569, filed Jul. 20, 2001 (now U.S. Pat. No. 6,501,402), which are both incorporated herein by reference in their entireties.

BACKGROUND OF THE INVENTION

1. Field of the Invention

This invention relates to digital-to-analogue converters, and particularly to converters which use an array of current sources to provide an analogue output.

2. Related Art

Digital-to-analogue converters of this type are widely used in numerous applications, and can be implemented as high speed converters suitable for use in telecommunication systems. In one arrangement, the array of current sources is arranged as a plurality of identical current sources. An associated switching array selectively routes the current source outputs to two possible output terminals. In some systems, one of these terminals is simply ground, and the other terminal is a current summing bus. The signal on the current summing bus is converted into a voltage before being provided as an output of the converter. In other systems, the output of the converter is to be provided on to twisted pair cabling. In this case, the current provided to one of the output terminals is converted to a voltage for one of the twisted pair wires, and the current provided to the other terminal is converted to a voltage for the other wire of the twisted pair. In this case, the converter output is represented as the difference between the voltage levels on the two wires of the twisted pair.

It has been recognised that to provide high precision, for example when converting more than 10 bits, it is necessary to calibrate the current sources constantly during the conversion process.

U.S. Pat. No. 5,870,044 discloses one circuit and method for providing calibration of the current sources used in the converter array. Essentially, an additional current source is provided, and the output of the additional current source is used to replace a current source within the array when that particular current source within the array is being calibrated. In this way, all current sources within the array can be calibrated in a cyclical manner. The additional current source avoids the need to interrupt the conversion process during calibration.

The calibration of individual current sources enables compensation for variations in layer thicknesses or other dimensions across the current source array. These variations across the array are static errors. There are also dynamic errors which result from the various parasitic capacitances within the current source circuits. After calibration of a current source to provide a desired output, changes in the charges stored on these parasitic capacitances vary the current source output over time. There is therefore also a need to carry out a continuous cyclical calibration process.

SUMMARY OF THE INVENTION

The invention is based on the recognition that a significant portion of the error in the output current of each current source will be a function of the time since that particular current source was calibrated. In particular, it has been recognised that there is a substantially linear increase in the error in the output current for each current source as a function of time since the most recent calibration of that current source.

According to the invention, there is provided a digital-to-analogue converter, comprising:

an array of current sources, each current source having an output which is switchable onto one of first and second terminals as a function of a digital input, such that a first number of current source outputs are switched to the first terminal and a second number of current source outputs are switched to the second terminal, wherein the current source outputs are also switchable to a calibration unit, the current sources of the array being calibrated cyclically, wherein the current source outputs switched to the first and second output terminals are selected as a function of the point within the calibration cycle.

One terminal may be an output and the other terminal may be ground. Alternatively, the two outputs may define a differential output signal.

The operation of the converter of the invention takes into account the current stage of the cyclic calibration process. For example, the average time since calibration for all current sources having outputs switched to the first terminal may be approximately equal to the average time since calibration for all current sources having outputs switched to the second terminal. In other words, the average time since calibration for each terminal is equal to half the calibration cycle duration.

By making the average time since calibration equal for the current sources switched to the two terminals, the average current of the cells switched to one terminal is identical to the average current of the cells switched to the other terminal, because the average current error is the same. The average current of the cells switched to each terminal remains constant in time and is independent of the digital input being converted. This ensures DAC linearity, both for single and double output systems.

In order to equal the average time since calibration for the current sources switched to the two terminals, the current sources most recently calibrated and the current sources calibrated the longest time ago may be switched to one of the output terminals, with the remaining current sources switched to the other output terminal.

The array of current sources may comprise a first plurality of identical current sources, the outputs of which are switched in dependence on the most significant bits of the digital input, and a second plurality of current sources, the outputs of which are switched in dependence on the least significant bits of the digital input.

This arrangement enables the advantages of identical current sources with the advantages of a binary array of current sources to be combined. In particular, the second plurality of current sources can comprise two current sources, and wherein the output of each current source of the second plurality is provided with a divider arrangement for providing the output on a plurality of lines, the currents on the individual lines being switchable to the first or second output terminals under the control of the least significant bits of the input.

This converter arrangement may implement a 14 bit converter, with 128 current sources for the seven most significant bits, and two current sources for the seven least significant bits.

The invention also provides a method of controlling a digital-to-analogue converter, the converter comprising an array of current sources, each current source having an output which is switchable onto one of first and second terminals as a function of a digital input, such that a first number of current source outputs are switched to the first terminal and a second number of current source outputs are switched to the second terminal, the method comprising:

cyclically calibrating the current sources of the array;

switching a first subset of the current source outputs to the first terminal and switching a second subset of the current source outputs to the second terminal, the first and second subsets together including all current sources other than the or each current source being calibrated, the switching being in dependence on the input digital signal, wherein the first and second subsets are selected as a function of the point within the calibration cycle.

BRIEF DESCRIPTION OF THE DRAWINGS/FIGURES

An example of the invention will now be described in detail with reference to the accompanying drawings.

DETAILED DESCRIPTION OF THE INVENTION

Figure 1:
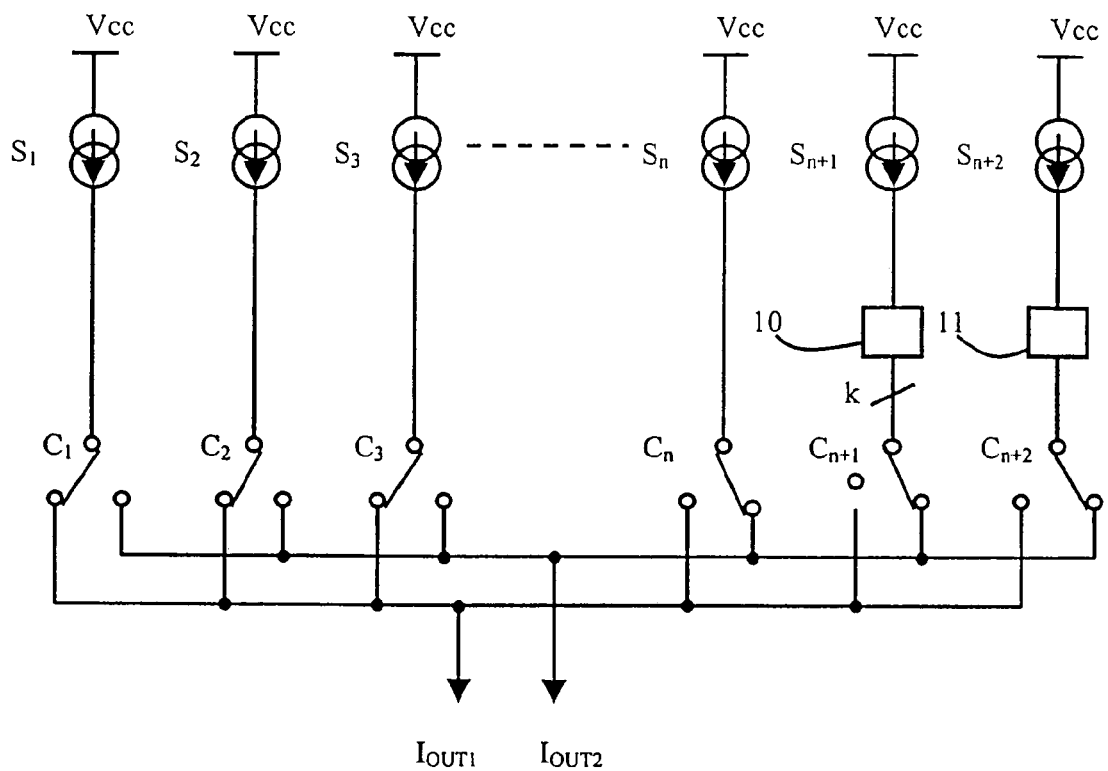
FIG. 1 shows a digital-to-analogue converter of the invention, and which is controlled in accordance with the method of the invention.

FIG. 1 shows a converter of the invention using an array of current sources S. For the N most significant bits of the digital word to be converted, an array of n identical current sources $S_1$ to $S_n$ is provided, where $n=2^N$. The outputs of these n current sources are switched to one of two outputs $I_{out1}$ and $I_{out2}$. The currents flowing to these two outputs are converted to voltages and may then be provided on output lines of the converter. The difference between the signals on the two lines provides the analogue output. Alternatively, one of the two outputs can be ground, and the output of the converter is then provided on a single line.

Only $2^N-1$ of these current sources are required to represent the N bits, and the additional $n^{th}$ current source is an additional current source used when one of the $2^N-1$ current sources is being calibrated.

FIG. 1 also shows a current source $S_{n+1}$, the output of which is provided to a divider 10, which provides a number of outputs k derived from the single current source $S_{n+1}$. This provides a compact way of converting the least significant bits of the digital input. Each of the k outputs of the divider 10 can also be switched selectively to either of the two outputs $I_{out1}$ and $I_{out2}$.

A second additional current source $S_{n+2}$ is used to provide the current derived from the LSBs when the current source $S_{n+1}$ is being calibrated. This second additional current source is provided with a divider circuit 11.

The arrangement of FIG. 1 essentially therefore provides an array of current sources, with each current source being switchable on to one of first and second output terminals as a function of the digital input. In this way, a first number of current source outputs are switched to the first output terminal and a second number of current source outputs are switched to the second output terminal.

The current sources must be calibrated, as mentioned above. In particular, the output current from a current source will vary over time as a result of leakage currents flowing within the circuitry of the current source. It has therefore been recognised that the current sources should be calibrated cyclically to maintain the desired accuracy of the conversion. For this purpose, the additional current source $S_n$ can be used to replace the output of any other current source $S_1$ to $S_{n-1}$ when that particular current source is being calibrated. The additional current source $S_{n+2}$ can be used to replace the output of current source $S_{n+1}$ when that current source is being calibrated. The current source outputs are switchable to a calibration unit (not shown in FIG. 1), and this is performed cyclically for all current sources of the array.

Figure 2:
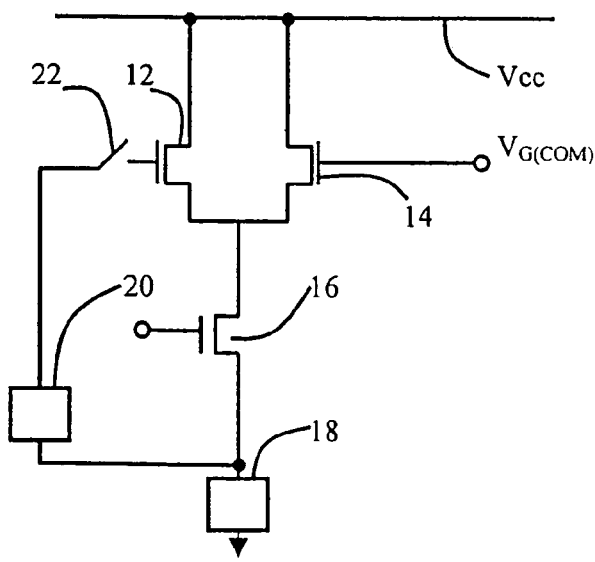
FIG. 2 is used to explain the calibration of individual current sources.

FIG. 2 shows one way in which an individual current source can be calibrated. Each current source may be arranged as first and second current source transistors 12, 14. The relative dimensions of the two transistors 12, 14 are such that the first transistor 12 provides a much smaller output current, and the majority of the output current of the current source is provided by the second transistor 14. For example, the first transistor 12 may provide 1/32 of the output current of the current source. This smaller transistor 12 has a gate voltage which is controlled to provide adjustment of the total current output of the current source. The gate voltage on the second transistor 14 is fixed, and is common for all current sources at $V_{G(com)}$. During calibration of the current source, the output is switched by transistor 16 to a reference current source 18, which forces the output of the current source to the desired value. A feedback control 20 provides an appropriate gate voltage on the transistor 12 for the current source to provide the desired output current. Switch 22 is closed during the calibration process, and is opened at the end of the calibration process, and the required gate control voltage is held on the gate of transistor 12 by the MOS gate capacitance.

After calibration of the current source, the leakage current of the switch 22 discharges the control gate voltage of transistor 12. This results in a change in the output current of the current source. This is predominantly a first order effect, which means that the resulting error in the output of the current source varies in a linear manner over time. The invention provides a method of operating a digital-to-analogue converter, such as that shown in FIG. 1, in such a way as to take advantage of this linear dependency of the output error of each current source on the time since calibration.

In accordance with the invention, the current source outputs which are switched to the two output terminals are selected as a function of the point within the calibration cycle. This enables the average time since calibration for all current sources switched to the first and second output terminals to be the same.

Figure 3:
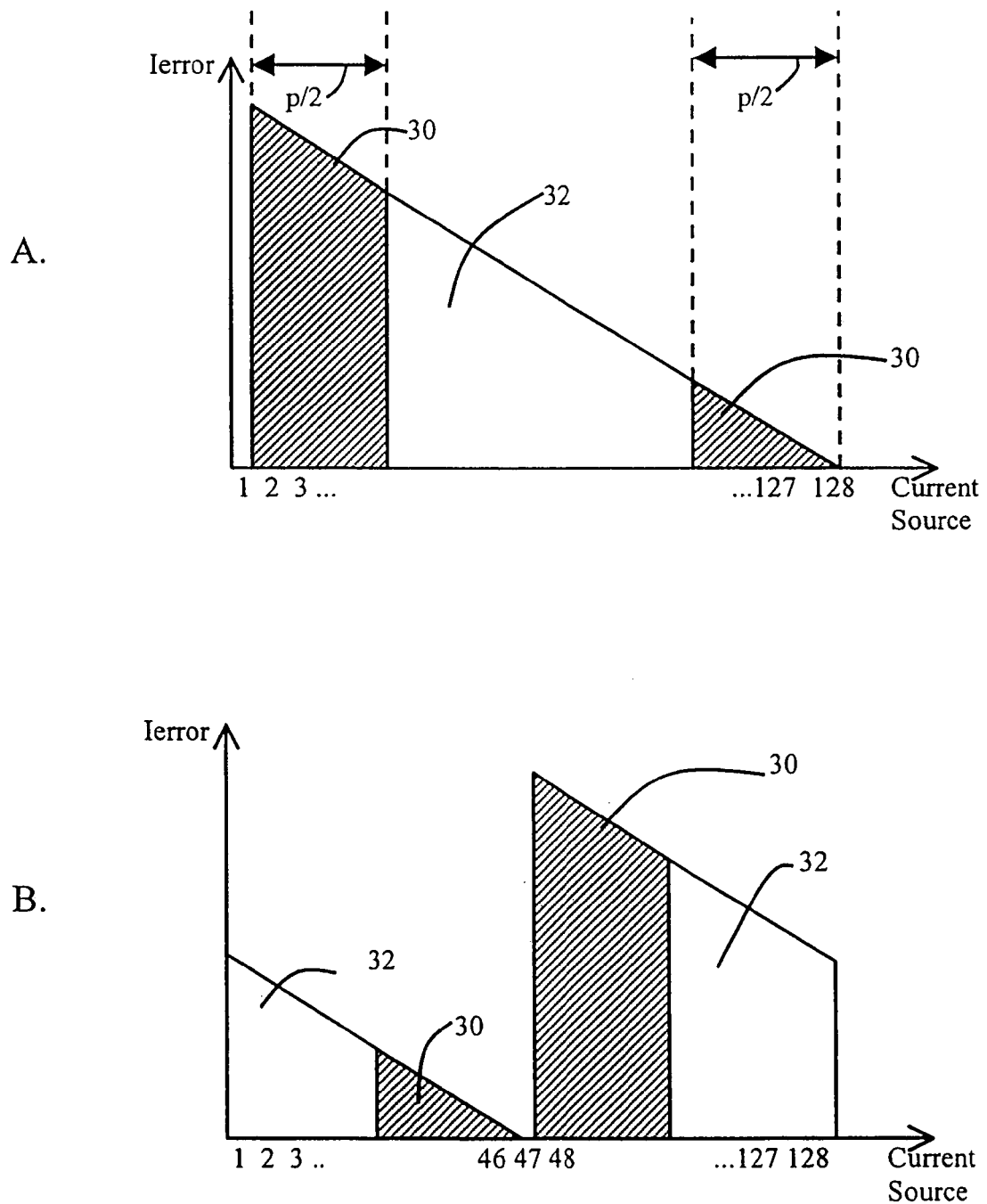
FIG. 3 is used to explain the operation according to the invention.

FIG. 3 is used to explain one way of implementing the method of the invention to achieve equal average time since calibration.

FIG. 3A shows the error in the output of each current source $S_1$ to $S_{128}$. This assumes there are seven most significant bits. The 128 current sources include the 127 current sources required for converting the seven most significant bits, as well as an additional current source required to enable simultaneous calibration to take place.

In the example of FIG. 3A, current source number 1 is assumed to be in the process of calibration, and the error in the output is therefore represented as 0. FIG. 3 assumes the current sources are calibrated in numerical order. As seen from FIG. 3A, current source 2 has the largest error, since the time since that current source was previously calibrated is the largest. There is a linear decrease in the error from current source 2 through to current source 128, which was calibrated during the previous calibration cycle.

In FIG. 3, the hatched areas 30 indicate the current sources, the outputs of which are switched to one of the terminals, and the non-hatched area 32 represents the current sources, the outputs of which are switched to the other output terminal.

If we assume the digital input requires a number p of current sources to be switched to the first output terminal, half of this output will be provided by current sources 2 to (1+p/2) and the other half will be provided by current sources (128−p/2) to 128. In other words, the current sources most recently calibrated and the current sources calibrated the longest time ago are switched to one of the output terminals, and the intermediate current sources are switched to the other output terminal. The result is that the average time since calibration for all current sources switched to the first output terminal is the same as the average time since calibration for all current sources switched to the second output terminal.

Since the average time from calibration for all current cells switched to one terminal remains constant, this approach improves the linearity, regardless of whether a two terminal differential output is provided or a single terminal output.

FIG. 3B shows the same technique as described with reference to FIG. 3A, when the current source being calibrated is number 47.

Although the method described with reference to FIG. 3 takes the most recently calibrated current sources and the current sources calibrated the longest time ago, other schemes exist for ensuring that the average output errors remain the same.

The effect of ensuring substantially equal average errors of the current sources switched to each output is that the error is constant. It is therefore possible to assume that all current cells have the same output current value, which may be slightly different to the ideal level. This difference results in slightly modified converter gain, but the linearity is preserved. This means the same step between successive outputs is provided with suppressed harmonics and low noise. This linearity can be more important than the absolute gain.

Figure 4:
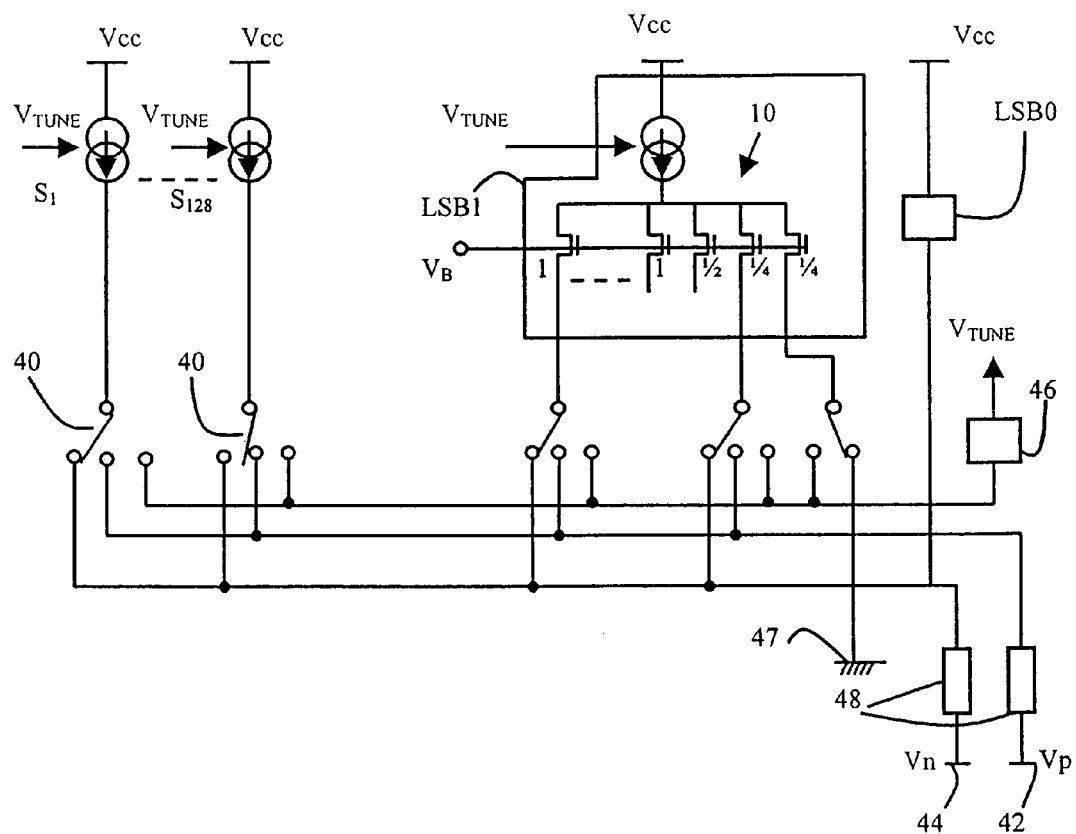
FIG. 4 shows in greater detail a preferred converter architecture of the invention.

FIG. 4 shows one specific example of digital-to-analogue converter according to the invention. This specific example is arranged as a 14 bit converter. For the seven most significant bits, an array of 128 current sources $S_1$ to $S_{128}$ are provided. 127 of these are in use at any one time, and one is being calibrated. As described with reference to FIG. 2, calibration involves applying a tuning voltage $V_{TUNE}$. The output of each of these MSB current sources is provided to a three way switch 40 which enables the current source output to be routed to the positive output 42, the negative output 44 or the calibration unit 46. A single current source LSB1 is provided for generating outputs dependent upon the seven least significant bits. This current source LSB1 has a divider 10 at its output. This comprises an array of transistors with a common gate voltage $V_B$, and the width to length ratio of the transistor channel determines the source-drain current flowing through each transistor. The array of transistors is arranged as 31 transistors each providing an output which is 1/32 of the total current source output, one transistor providing an output of 1/64 and two outputs each providing 1/128 of the current source output. One of these 1/128 outputs is used only during calibration of the current source and is switched to ground 47 during the use of the current source LSB1. All other outputs are switched to the positive or negative output terminals 42,44 during the use of the current source LSB1 and to the calibration unit during calibration. During calibration, all outputs are thus switched to the calibration unit and the combined output current should then be equal to the output current of one of the MSB current sources. This enables the same calibration unit to be used for calibrating the MSB and LSB current sources.

The combined currents flowing to the two output terminals are converted to voltages by resistors 48. During calibration of the current source LSB1, an additional current source is required providing the same scaled outputs. For this purpose, the second current source for the least significant bits is provided. This is shown only schematically as LSB0 in FIG. 4 but corresponds to current source $S_{n+2}$ and divider 11 in FIG. 1.

Although not shown in FIG. 1 or 4, additional switches are required to prevent the output current from a current source from flowing to the positive or negative outputs when the current source is being calibrated.

The calibration circuit 46 essentially comprises additional current sources providing a reference output to which the current sources of the converter are tuned. This reference output may be derived from a number of additional current sources distributed around the substrate of the converter. This ensures that the reference output is within the range of each individual current source that can be achieved by controlling the transistor 12, shown in FIG. 2. The full array of current sources may be arranged as a two-dimensional array, for example with 13 columns and 12 rows. For the 14 bit converter of FIG. 4, this provides 16 current source circuits in addition to the 130 required by the converter. Some or all of these 16 additional current sources are used for biasing and reference purposes, in conventional manner.

The method of the invention enables a significant improvement in the signal to noise ratio at the output of the converter, particularly the signal to noise ratio of the current output. The signal to noise ratio of the voltage output of the converter has increased noise as a result of the temperature dependence of the resistors 48 used for conversion of the current output to a voltage.

One preferred calibration cycle involves calibrating half of the MSB current sources (for example current sources $I_1$ to $I_{64}$), calibrating one of the LSB current sources, calibrating the remaining MSB current sources (for example $I_{65}$ to $I_{128}$) and finally calibrating the other LSB current source. By way of example, the converter may be running with a clock speed of 17.664 MHz, and one clock cycle is required for a D/A conversion. Each calibration operation may occupy 256 clock cycles (14.5 μs) which gives a total calibration time for the 130 current sources of 1.88 ms. This corresponds to a calibration frequency of 531 Hz.

The invention provides a scheme by which the current sources are selected based on the time since calibration. In the specific example above, the average time since calibration is selected to be equal so that for all outputs of the DAC, the current source error can be considered to be a constant value, thereby preserving linearity of the converter. It is also possible to select the current sources according to different criteria. For example, it is possible to select the current source outputs such that the total error in the summed current provided to the two outputs is as close as possible to equal. In this case, the total time since calibration for all current sources having outputs switched to the first output terminal is as close as possible to the total time since calibration for all current sources having outputs switched to the second output terminal.

The invention enables the effect of switch leakage currents to be reduced or cancelled. Higher conversion accuracy can thus be achieved. This increased accuracy may be used to enable the calibration frequency to be reduced, and also enables a reduction in the required MOS gate capacitance, as the charge leakage resulting from a reduced gate capacitance is compensated. The selection of cells based on the calibration cycle also means that different current cells are used for the same digital input depending on the prevailing stage within the calibration cycle. This has a further averaging effect which improves the converter linearity.

Further advantages and features of the invention will be apparent to those skilled in the art.

What is claimed is:

1. A method, comprising:
   (a) forming a current source with first and second transistors;
   (b) producing a smaller output current with the first transistor than with the second transistor;
   (c) varying a value of a reference voltage input to the first transistor to adjust an output current produced by the current source;
   (d) performing step (c) until a desired output current is achieved based on the reference voltage;
   (e) providing an unswitched fixed gate voltage to the second transistor.

2. The method of claim 1, wherein step (b) comprises providing the first transistor with smaller dimensions than the second transistor.

3. The method of claim 1, wherein step (c) comprises providing the reference voltage to a gate of the first transistor.

4. The method of claim 1, further comprising converting a reference current from a reference current source to generate the reference voltage.

5. The method of claim 1, further comprising forming an array of current sources and cyclically performing steps (b), (c), and (d) for each current source in the array of current sources.

6. The method of claim 1, wherein the current source is calibrated by performing steps (b), (c), and (d).

* * * * *